United States Patent [19]

Freisen et al.

[11] Patent Number: 4,701,710

[45] Date of Patent: Oct. 20, 1987

[54] NUCLEAR MAGNETIC RESONANCE TOMOGRAPHY APPARATUS

[75] Inventors: Ludger Freisen, Erlangen; Helmut Kess, Nuremberg; Norbert Krause, Heroldsbach; Ralph Meissner, Erlangen, all of Fed. Rep. of Germany

[73] Assignee: Siemens Aktiengesellschaft, Berlin and Munich, Fed. Rep. of Germany

[21] Appl. No.: 736,768

[22] Filed: May 22, 1985

[30] Foreign Application Priority Data

Jun. 7, 1984 [DE] Fed. Rep. of Germany ....... 3421291

[51] Int. Cl.$^4$ ............................................. G01R 33/20
[52] U.S. Cl. ..................................... 324/318; 324/307
[58] Field of Search ............... 324/300, 307, 309, 311, 324/312, 313, 314, 318, 320

[56] References Cited

U.S. PATENT DOCUMENTS

| 3,427,532 | 2/1969 | Nelson | 324/322 |
| 4,051,429 | 9/1977 | Imanari et al. | 324/311 |
| 4,409,550 | 10/1983 | Fossel et al. | 324/300 |
| 4,411,270 | 10/1983 | Danadiar | 324/309 |
| 4,443,761 | 4/1984 | Levitt | 324/311 |
| 4,506,224 | 3/1985 | Krause | 324/319 |
| 4,520,315 | 5/1985 | Loeffler et al. | 324/309 |
| 4,521,732 | 6/1985 | Pegg et al. | 324/300 |

FOREIGN PATENT DOCUMENTS 0107238  5/1984  European Pat. Off. .

0033156  2/1983  Japan ..................................... 324/307

OTHER PUBLICATIONS

P. N. Jenkins et al., "A 'Double-Lock' Nuclear Magnetic Resonance Spectrometer System for Heteronuclear Double Irradiation Studies", J. of Physics E. (GB), vol. 4, No. 10, Oct. 1971.

Brondeau et al. "Flexible Fourier Multinuclear Magnetic Resonance Spectrometer", Review of Scientific Instruments, vol. 52, No. 4, Apr. 1981, pp. 542–547.

*Primary Examiner*—Stewart J. Levy
*Assistant Examiner*—Scott M. Oldham
*Attorney, Agent, or Firm*—Hill, Van Santen, Steadman & Simpson

[57] ABSTRACT

For the representation of images of regions selected from the interior of an examination subject, coils are provided for the application of a primary magnetic field and of magnetic gradient fields to the examination subject. An electrical conductor configuration detects the deflection of the atomic nuclei of the examination subject from their position of equilibrium as a result of high frequency magnetic excitation pulses. The configuration is formed by two interspersed individual conductor configurations adapted for respective different measurement frequencies. Each configuration comprises parallel conductors connected at their ends and arranged in spaced relation to an electrically grounded surface to form a transmission line configuration resonant at a respective one of the measurement frequencies.

7 Claims, 2 Drawing Figures

NUCLEAR MAGNETIC RESONANCE TOMOGRAPHY APPARATUS

BACKGROUND OF THE INVENTION

The invention relates to a nuclear magnetic resonance tomography apparatus for the display of images of regions selected from the interior of an examination subject, such apparatus comprising coils for the application of a primary magnetic field and of gradient magnetic fields to the examination subject, and an electrical conductor configuration for the detection of the deflection of the atomic nuclei of the examination subject from an equilibrium position as a result of the application of high-frequency magnetic excitation pulses.

An apparatus of this type is described in U.S. Pat. No. 4,520,315. This apparatus is suited for deflecting the hydrogen atomic nuclei of the examination subject and detecting their return to the position of equilibrium.

The desire exists to prepare not only proton (hydrogen) images, but also images with other nuclei; for example, phosphorus. This is possible if radio frequency conductor configurations are respectively employed which have a homogeneous response for alternating magnetic fields covering the respective measurement frequency bands. The resonant frequency for proton imaging, for example, may be in the region of 64 MHz, while the corresponding resonant frequency for imaging with phosphorus nuclei would be in the vicinity of 26 MHz. Accordingly, detector configurations having different operating frequencies are required for producing images with different nuclei.

SUMMARY OF THE INVENTION

The object underlying the invention resides in designing a nuclear magnetic resonance tomography apparatus of the initially cited type such that measurements based on excitation of different nuclei are possible without exchange of detector configurations.

In accordance with the invention, this objective is achieved in that the detector configuration is formed by two interspersed individual antennas for different frequencies, each of which is comprised of one or more groups of parallel rods which are interconnected at their ends. In the case of the inventive nuclear magnetic resonance tomography apparatus, the examination subject is surrounded by the interspersed individual detector configurations for the two different frequencies, each configuration being capable of being individually switched on and employed for measurement. Accordingly, the deflection excitation and measurement in the case of two different frequencies are possible. These frequencies can preferably be 64 MHz for proton spectroscopy and proton imaging, and 26 MHz for phosphorus spectroscopy and phosphorus imaging.

The invention shall be explained in greater detail in the following on the basis of the accompanying drawing sheets; and other objects, features and advantages will be apparent for this detailed disclosure and from the appended claims.

DETAILED DESCRIPTION

Figure 1:
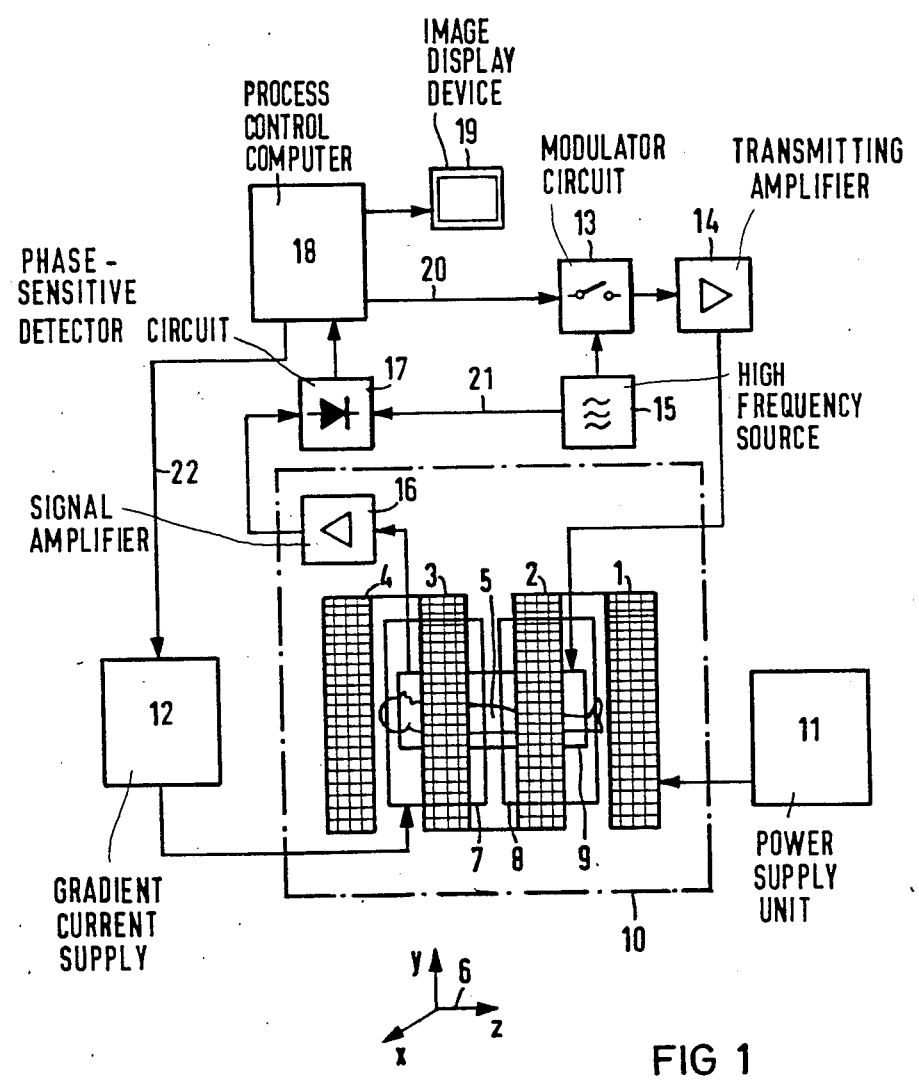
FIG. 1 is a diagrammatic illustration showing a nuclear magnetic resonance tomography apparatus for the purpose of explaining the inventive idea.
Figure 2:
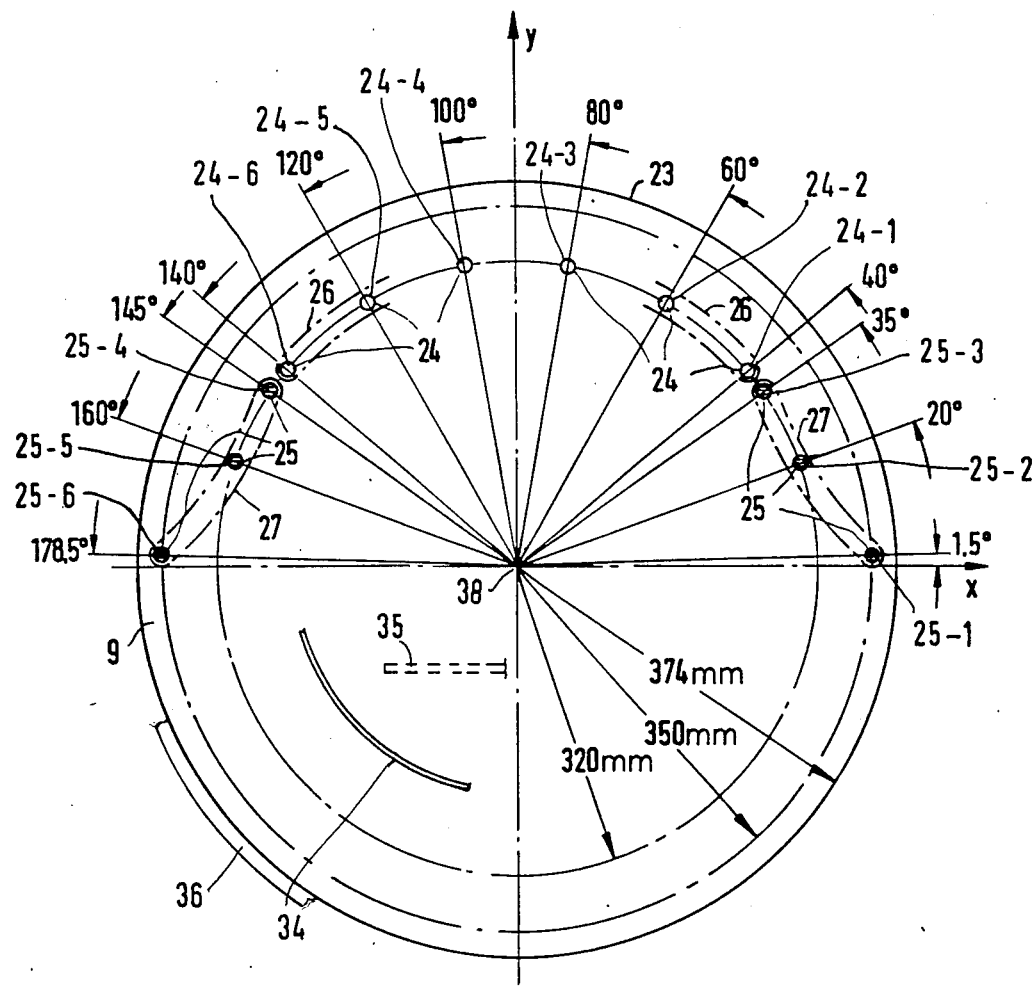
FIG. 2 is a diagrammatic end view showing significant parts of an inventive nuclear magnetic resonance tomography apparatus.

In FIG. 1, 1 and 2 as well as 3 and 4 designate coils with which a DC primary magnetic field $B_0$ is generated in which, in the case of application for medical diagnostics, the body 5 of a patient to be examined is disposed. In addition, associated with the latter are gradient coils which are provided for the generation of independent, mutually perpendicular magnetic field gradients of respective directions corresponding to x, y, and z axes as represented at 6. In FIG. 1, for the purpose of clarity, only gradient coils 7 and 8 are illustrated which, together with a pair of opposite, similar gradient coils, serve the purpose of generation of an x-gradient magnetic field. The similar, not illustrated, y-gradient coils are disposed parallel to a horizontal plane occupied by body 5 and are located above and below such horizontal plane. The gradient coils producing the z-gradient field are disposed transversely to the longitudinal axis of body 5 at the head and at the foot end of the examination space. The arrangement additionally contains an antenna system 9 serving the purpose of exciting nuclear magnetic resonance and receiving the resulting nuclear magnetic resonance signals.

The components 1 through 9, bounded by a line 10 consisting of dashes and dots, represent the actual examination instrument. It is operated from an electric arrangement which comprises a power supply unit 11 for the operation of the coils 1 through 4, as well as a gradient current supply 12 to which the gradient coils 7 and 8 as well as the additional gradient coils are connected. The antenna system 9, serving both the purpose of exciting and receiving the signal, is connected via a modulator 13 and a transmitting amplifier 14 to a high frequency oscillator 15, on the one hand, and, via a signal amplifier 16 and phase-sensitive detector 17, to a process control computer 18, on the other hand. A display screen device 19 is connected with the computer 18 for displaying an output image. For the control of the arrangement, connections 20, 21, and 22 are additionally provided between the computer 18 and the modulator 13, between the oscillator 15 and the phase sensitive detector 17, and between the computer 18 and the gradient current supply 12. The basic method of operation of an apparatus of FIG. 1 is described in the aforementioned U.S. Pat. No. 4,520,315.

FIG. 2 is a more precise illustration of the antenna system 9 of the apparatus. From FIG. 2 it is apparent that the overall antenna system 9 is formed by two individual conductor groups designed respectively for transmitting and receiving different frequencies. Each group is connected to a cylindrical ground plane in the form of a common cylindrical interior conductive surface 23 which surrounds the entire length of the examination region receiving the examination subject 5 and serves as an electrical ground connection for both of the conductor groups. The individual groups respectively consist of parallel rods 24, (six such rods 24-1 through 24-6 being shown in the embodiment of FIG. 2) interconnected at their ends by of a conductor 26 and parallel rods 25 (six such rods 25-1 through 25-6 being shown in the embodiment of FIG. 2) 27. The group comprised of the rods 24 is for operation at 64 MHz. The rods 25 form a group for operation at 26 MHz. In FIG. 2, the groups of rods 24 and 25 are arranged symmetrically to the x-axis and are not shown for the lower portion. The angular positions relative to an x-axis for the upper groups of conductive rods 24 and 25 are indicated in angular degrees. In order to distinguish the rods 24 from the rods 25, the rods 24 are illustrated in the form of open circles, and the rods 25 are illustrated with hatching. The respective radii on which the groups of rods 24 and 25 lie are indicated in millimeters in FIG. 2. The diameter of each of rods 24 and 25 is preferably about ten millimeters (10 mm).

A tube of synthetic material may be located as indicated at 34 in FIG. 2 surrounding the examination space and receiving a patient support 35 therein. A cylindrical support tube 36 consisting of synthetic material having an interior layer of conductive copper or silver may be used to provide the common cylindrical interior surface 23 connected to ground potential. The central longitudinal (z) axis is designated at 38.

The two individual conductor groups can be similarly or differently designed with respect to the arrangement of the conductors (rods). In this manner, the homogeneity range of the individual configurations can be formed and adapted to the specific task. FIG. 2 shows an embodiment with high homogeneity of the 64 MHz-system and lesser homogeneity of the 26 MHz-system.

The upper and lower groups of rods 24 and 25 of the individual configurations together substantially completely surround the patient.

It will be apparent that many modifications and variations may be made without departing from the scope of the teachings and concepts of the present invention.

We claim as our invention:

1. A nuclear magnetic resonance tomography apparatus for image-representation of regions of the interior or an examination subject, comprising:
    a first means for the generation of a DC magnetic field,
    second means for the generation of mutually perpendicular magnetic field gradients, and
    antenna means for exciting and receiving signals characteristic of nuclear magnetic resonance including:
        cylindrical ground plane means disposed around a longitudinal axis,
        a plurality of parallel conductive rod members disposed within said cylindrical ground plane means and spaced therefrom, and
        interconnecting conductive members linking the ends of respective sets of said rod members to each other to form at least two distinct groups of rod members, said distinct groups being respectively sensitive to resonant frequencies of an equivalent number of distinct atomic nuclei and at least one of said distinct groups including rod members spaced at more than one radius from the axis of said cylindrical ground plane means.

2. A nuclear magnetic resonance tomography apparatus for examining an examination subject, said apparatus comprising:
    means for generating a fundamental magnetic field in which said subject is disposed;
    means for generating a plurality of orthogonal gradient magnetic fields in which said subject is also disposed; and
    an antenna system for inducing spins of selected nuclei in said subject and for receiving nuclear magnetic resonance signals as a result thereof, said antenna system consisting of a plurality of groups of parallel conductive rod elements arranged around a longitudinal axis, all rod elements in a group being interconnected by a respective conductive member of each group attached to the ends of the rods in the group, each group of rod elements being respectively sensitive to a resonant frequency for a different type of atomic nucleus, and at least one of said groups including rod elements spaced at different distances from said axis.

3. A nuclear magnetic resonance tomography apparatus as claimed in claim 2, wherein the number of said groups of conductive rod elements is 2.

4. A nuclear magnetic resonance tomography apparatus as claimed in claim 2, wherein one of said groups of conductive rod elements is sensitive to a resonant frequency of 26 MHz and another of said groups of conductive rod elements is sensitive to a resonant frequency of 64 MHz.

5. A nuclear magnetic resonance tomography apparatus as claimed in claim 2, wherein the number of groups of rod elements is two, and wherein the respective resonant frequencies to which said two groups of rod elements are sensitive have a ratio of at least 2-to-1.

6. A nuclear magnetic resonance tomography apparatus as claimed in claim 2, wherein said rod elements of said plurality of groups of rod elements are arranged generally in a cylindrical pattern surrounding said subject.

7. A nuclear magnetic resonance tomography apparatus as claimed in claim 2, further comprising a cylindrical grounding and shielding element surrounding said groups of conductor rods and electrically connected thereto.

* * * * *